United States Patent
Ling et al.

(10) Patent No.: US 6,479,350 B1
(45) Date of Patent: *Nov. 12, 2002

(54) REDUCED MASKING STEP CMOS TRANSISTOR FORMATION USING REMOVABLE AMORPHOUS SILICON SIDEWALL SPACERS

(75) Inventors: Zicheng Gary Ling, San Jose, CA (US); Todd Lukanc, San Jose, CA (US); Raymond T. Lee, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/639,814

(22) Filed: Aug. 17, 2000

Related U.S. Application Data

(60) Provisional application No. 60/149,420, filed on Aug. 18, 1999.

(51) Int. Cl.[7] .............................................. H01L 21/336
(52) U.S. Cl. ...................... 438/265; 438/199; 438/231; 438/305
(58) Field of Search ................................. 438/265, 199, 438/202, 203, 204, 205, 230, 231, 234, 236, 304–309, 326, 332

(56) References Cited

U.S. PATENT DOCUMENTS 6,060,738 A * 5/2000 Hidaka et al.
6,103,563 A * 8/2000 Lukanc et al. .............. 438/231

* cited by examiner

Primary Examiner—Wael Fahmy
Assistant Examiner—D. M. Collins

(57) ABSTRACT

CMOS semiconductor devices comprising MOS transistors of different channel conductivity type are formed in or on a common semiconductor substrate using a minimum number of critical masks. Embodiments include forming conductive gate/insulator layer stacks on spaced-apart, different conductivity portions of the main surface of the substrate, forming etch-resistant inner sidewall spacers on side surfaces of the layer stacks, and forming easily etched, amorphous semiconductor disposable outer sidewall spacers on the inner sidewall spacers. The use of disposable outer sidewall spacers allows heavy and light source/drain implantations of opposite conductivity type to be performed for forming PMOS and NMOS transistors with the use of only two critical masks, thereby reducing production cost and duration, while increasing manufacturing throughput.

18 Claims, 7 Drawing Sheets

REDUCED MASKING STEP CMOS TRANSISTOR FORMATION USING REMOVABLE AMORPHOUS SILICON SIDEWALL SPACERS

RELATED APPLICATIONS

This application claims priority from U.S. Provisional Application Ser. No. 60/149,420, filed Aug. 18, 1999, incorporated herein by reference.

FIELD OF THE INVENTION

The present invention relates to a method of manufacturing semiconductor devices, i.e., CMOS-type transistor devices and integrated circuits comprising such devices, with improved processing methodology resulting in increased reliability and quality, increased manufacturing throughput, and reduced fabrication cost. The present invention has particular applicability in fabricating high-density integration semiconductor devices with design features below about 0.18 μm, e.g., about 0.15 μm.

BACKGROUND OF THE INVENTION

The escalating requirements for high density and performance associated with ultra-large-scale integration (ULSI) semiconductor devices require design features of 0.18 μm and below, such as 0.15 μm and below, increased transistor and circuit speeds, high reliability, and increased manufacturing throughput for economic competitiveness. The reduction of design features to 0.18 μm and below challenges the limitations of conventional semiconductor manufacturing techniques.

As feature sizes of MOS and CMOS devices have decreased to the sub-micron range, so called "short channel" effects have arisen which tend to limit device performance. For n-channel MOS transistors, the major limitation encountered is caused by hot-electron-induced instabilities. This problem occurs due to high electrical fields between the source and drain, particularly near the drain, such that charge carriers, either electrons or holes, are injected into the gate or semiconductor substrate. Injection of hot carriers into the gate can cause gate oxide charging and threshold voltage instabilities which accumulate over time and greatly degrade device performance. In order to counter and thus reduce such instabilities, lightly-doped source/drain extension-type transistor structures have been developed, as describe below.

For p-channel MOS transistors of shortchannel type, the major limitation on performance arises from "punch-through" effects which occur with relatively deep junctions. In such instances, there is a wider subsurface depletion effect and it is easier for the field lines to go from the drain to the source, resulting in the above-mentioned "punch-through" current problems and device shorting. To minimize this effect, relatively shallow junctions are employed in forming p-channel MOS transistors.

The most satisfactory solution to date of hot carrier instability problems of MOS and CMOS devices is the provision of lightly- or moderately-doped source/drain extensions driven just under the gate region, while the heavily-doped source/drain regions are laterally displaced away from the gate by use of at least one sidewall spacer on the gate. Such structures are particularly advantageous because they do not have problems with large lateral diffusion and the channel length can be set precisely.

Several processing sequences or schemes have been developed for the manufacture of lightly- or-moderately-doped source/drain extension-type MOS and CMOS transistors for use in high-density integration applications, with a primary goal of simplifying the manufacturing process by reducing and/or minimizing the requisite number of processing steps. Conventional processing schemes for making such MOS and CMOS transistors generally employ disposable sidewall spacers formed on opposing side surfaces of a thin gate insulator/gate electrode layer stack, which sidewall spacers form part of a mask during ion implantation processing for forming laterally-displaced, heavily-doped source/drain regions in the semiconductor substrate on opposite sides of the layer stack.

According to one conventional process scheme employing disposable (i.e., removable) sidewall spacers for making MOS transistors, a precursor structure is provided comprising a semiconductor substrate of one conductivity type and having a layer stack as described above formed on a portion of the substrate surface is subjected to blanket-type dielectric layer deposition and patterning (as by anisotropic etching) to form a sidewall spacer on opposing side surfaces of the layer stack. Opposite conductivity type r or n-type dopant impurities are then implanted into the substrate using the layer stack with sidewall spacers formed thereon as an implantation mask, to thereby form moderately- to heavily-doped implants. High temperature annealing is then performed to thermally activate and diffuse the implanted dopant and reduce lattice damage due to implantation, thereby forming source/drain regions and associated junctions at a predetermined dopant density and depth below the substrate surface. The effective length of the channel of such transistors is determined by the width of the gate insulator/gate electrode layer stack and the width of the sidewall spacers formed thereon. After activation annealing, the sidewall spacers are removed, as by etching, and a second implantation process for implanting n- or p-type opposite conductivity type dopant impurities into the substrate is performed using only the gate insulating layer/gate electrode layer stack as an implantation mask, thereby forming shallow-depth, lightly- or moderately-doped source/drain regions. Following this implantation, a second activation process, e.g., rapid thermal annealing (RTA), is performed for effecting dopant diffusion/activation and relaxation of implantation-induced lattice damage of the implants, to form shallow-depth, lightly- or moderately-doped source/drain extensions extending from respective proximal edges of the heavily-doped source/drain regions to just below the respective proximal edges of the gate insulator/gate electrode layer stack.

In a variant of the above-described process, the sidewall spacers are comprised of a relatively narrow layer of a first (or inner) dielectric material and a relatively wide layer of a second (or outer) dielectric material. According to the process methodology of this variant, only the second, or relatively wide, outer dielectric sidewall spacer layer is removed subsequent to annealing for forming the moderately to heavily-doped source/drain regions. The first, or relatively thin, inner dielectric sidewall spacer layer is retained throughout subsequent processing for protecting the gate insulator layer/gate electrode layer stack, eg., during contact formation.

A conventional approach employing processing methodology such as described above, for forming MOS transistors of different channel conductivity type in or on a common substrate, e.g., CMOS devices, is illustrated in FIGS 1(A)–1(G). As shown in FIG. 1(A), field oxide areas 115 (or other conventional isolation means, e.g., shallow trench isolation (STI)) are formed, as by local oxidation of silicon (LOCOS), in semiconductor substrate 100, typically of monocrystalline silicon, to electrically separate p-type regions 101 and n-type regions 102 formed therein, as by conventional dopant diffusion or implantation. A layer stack comprising a thin gate oxide layer 105 formed in contact with substrate 100, as by thermal oxidation, and an overlying conductive gate electrode layer 100, such as heavily-doped polysilicon, is formed over a portion of the surface area of each of the oppositely doped regions 101 and 102. Referring to FIG. 1(B), a first patterned photoresist mask M1 is then formed over n-type region 102 and its associated layer stack 105/110 and p-type region 101 is implanted, as by ion implantation, with n-type dopant impurities NLDD to form lightly- or moderately-doped regions 120, termed "shallow source/drain extensions". Adverting to FIG. 1(C), first mask M1 is then removed, and p-type region 101 implanted with n-type impurities and associated layer stack 105/110 are masked with second patterned photoresist mask M2. N-type region 102 is thereafter implanted, as by ion implantation, with p-type dopant impurities PLDD to form lightly- or moderately-doped shallow source/drain extensions 125.

Next, as shown in FIG. 1(D), sidewall spacers 130 are formed on opposing side surfaces of each of the gate oxide/gate electrode layer stacks 105/110, as by depositing a blanket layer of a dielectric material, e.g., silicon nitride, followed by anisotropic etching to selectively remove laterally extending portions of the blanket layer. Referring to FIG. 1(E), a third photoresist mask M3 is then formed over n-type region 102 and associated layer stack 105/110 previously implanted with p-type impurities and p-type region 101 and associated layer stack 105/110 previously implanted with n-type impurities is subjected to a second implantation of n-type dopant impurities NS/D, as by ion implantation, to form heavily doped, deeper source/drain regions 135, which include the shallower, lightly- or moderately-doped source/drain extensions 120. Adverting to FIG. 1(F), third mask M3 is then removed, and p-type region 101 and associated layer stack 105/110 implanted with n-type impurities NS/D is then masked with fourth patterned photoresist mask M4. N-type region 102 and associated layer stack 105/110 is thereafter implanted, as by ion implantation, with p-type dopant impurities PS/D to form heavily-doped, deeper source/drain regions 140, which include the shallower, lightly- or moderately-doped source/drain extensions 125. Fourth mask M4 is then removed, resulting in the structure shown in FIG. 1(G).

Source/drain implants NS/D and PS/D are typically implanted at a higher energy and dosage than lightly- or moderately-doped source/drain extension implants NLDD and PLDD, so that source/drain implants NSMD and PSMD penetrate deeper into the respective p-type and n-type regions 101 and 102 of substrate 100 than lightly- or moderately-doped source/drain extension implants NLDD and PLDD. In addition, sidewall spacers 130 prevent moderate or heavy source/drain implants NS/D and PMSD from entering respective p-type and n-type regions 101 and 102 adjacent to or beneath gate oxide/gate electrode layer stacks 105/110 to obtain the above-described benefits accruing from such spacing. Thus the resulting source/drain regions 135 and 140 each include a step at the respective edges thereof proximal the layer stacks 105/110, the width of the step substantially corresponding to the width of the spacers 130 at the bottom ends thereod adjacent the substrate 100 surface.

Disadvantageously, the above-described methodology employs four separate patterned photoresist masks M1–M4, each of which requires steps for spinning on of the photoresist, exposure via a stepper, development of the exposed photoresist, and stripping off of the patterned mask subsequent to ion implantation. Each of these steps materially adds to the cost of the semiconductor device and decreases manufacturing throughput. In addition, the device is subjected to additional handling and manipulation, thereby increasing the likelihood of defect formation.

Moreover, and very importantly, each of masks M1–M4 is a "critical mask", i.e., extremely complex and difficult to design and use. The large number of very fine features required to form the masks challenges the capabilities of the photolithographic processing necessary to implement them, thereby increasing manufacturing costs and reducing production throughput. As design rules for device formation are reduced to 0.18 $\mu$m and below, e.g., 0.15 $\mu$m and below, to meet increasing demands for microminiaturization and higher circuit density, shrinking feature sizes cause masks M1–M4 to become even more difficult and costly to design and use.

The related, copending U.S. patent applications referred to supra disclose methodologies for manufacturing MOS and CMOS semiconductor devices with a reduced number of critical masks, wherein gate insulator/gate electrode layer stacks are formed on the main surface of a semiconductor substrate, and disposable sidewall spacers are formed on opposing side surfaces of the layer stacks. A first mask is then formed on some of the layer stacks, the mask extending onto the main surface of the substrate adjacent the masked layer stacks to cover intended source/drain regions to be implanted with dopant impurities of a first conductivity type.

Moderate or heavy source/drain implants of dopant impurities of a second, opposite conductivity type are then formed in the substrate by ion implantation adjacent to the unmasked (i.e., exposed) layer stacks. The disposable sidewall spacers on the unmasked layer stacks are then removed, and lightly- or moderately-doped, shallow, source/drain extension implants of the second conductivity type are formed in the substrate by ion implantation. The first mask is then removed and a second photoresist mask is formed on the previously unmasked layer stacks, the mask extending onto the main substrate surface to cover the previously formed source/drain implants. Moderate or heavy source/drain implants of first conductivity type dopant impurities are then formed, the remaining disposable sidewall spacers are removed from the exposed layer stacks, and lightly- or moderately-doped source/drain extension implants of first conductivity type are then formed. The thus-implanted substrate is thereafter heated to diffuse and electrically activate the implants, thereby forming source/drain regions in the substrate.

By reversal of the conventional MOS/CMOS transistor formation sequence of lightly- or moderately-doped source/drain extension implantation followed by heavy source/drain implantation, and by employing disposable sidewall spacers, the methodologies of the abovementioned co-pending applications reduce the requisite number of critical masking steps from four to two. However, since the disposable spacers are removed during the transistor formation process, a spacer must be re-formed on the sidewalls of the gate oxide/gate electrode layer stack prior to contact formation, e.g., silicide contacts. Moreover, since there are no spacers on the layer stack sidewalls when the lightly or moderately-doped source/drain extension implants are performed, dopant impurities are implanted immediately adjacent the layer stack, which dopant impurities diffuses under the layer stack during subsequent thermal treatment, as by annealing, to form the source/drain junctions. For optimal transistor performance, the source/drain junctions are typically located proximal to, but not under, the edges of the gate oxide layer. Thus, the methodologies of the above-mentioned co-pending applications result in source/drain junction placement that adversely affects the electrical characteristics of the final device.

Accordingly, there exists, a need for improved semiconductor manufacturing methodology for fabricating MOS and CMOS transistors which does not suffer from the above-described drawbacks associated with the methodology of the conventional an and that of the above-described co-pending applications. Moreover, there exists a need for an improved, reduced critical mask requirement MOS/CMOS fabrication process which is filly compatible with conventional process flow and provides increased manufacturing throughput and product yield.

The present invention fully addresses and solves the above-mentioned problems and drawbacks attendant upon conventional processing and processing according to the above-mentioned co-pending applications for forming submicron-dimensioned MOS and CMOS transistors for use in high-density semiconductor integrated circuit devices, particularly in providing a process employing only two critical masking steps and inner and outer sidewall spacers, wherein the disposable outer spacers are wider than the thin inner spacers and provide the bulk of the masking function during implantation for forming heavily-doped source/drain regions laterally spaced from the respective proximal edges of the gate oxide/gate electrode layer stacks. In addition, the outer spacers are fabricated of a relatively easily etched amorphous semiconductor material, e.g., amorphous silicon, whereby the use of strong and harsh etching environments and conditions for spacer removal which can increase the likelihood of defect formation, is advantageously avoided. The thin inner spacers are preferably formed of a relatively etch-resistant material and are retained for the entire device processing sequence for prevention of dopant diffusion under the gate oxide layer stack during thermal annealing treatment and for protecting the layer stack during removal of the second, outer spacers and subsequent silicidation and/or metallization processing for contact formation.

DISCLOSURE OF THE INVENTION

An advantage of the present invention is an improved method for manufacturing MOS/CMOS transistor devices utilizing a reduced number of implantation masks.

Another advantage of the present invention is an improved method for manufacturing MOS/CMOS transistor devices utilizing removable sidewall spacers.

Still another advantage of the present invention is a method of forming a CMOS device comprising a plurality of MOS devices of different channel conductivity type in or on a common substrate, using a minimal number of critical masks, thereby reducing manufacturing costs and and product defects while increasing production throughput, which method enables optimization of the location of the source/drain junctions of the final device structure and protection of the gate insulator/gate electrode layer stack during processing for contact formation.

Additional advantages and other features of the present invention will be set forth in the description which follows and in part will become apparent to those having ordinary skill in the art upon examination of the following or may be learned from the practice of the instant invention. The advantages of the present invention may be realized and obtained as particularly pointed out in the appended claims.

According to an aspect of the present invention, the foregoing and other advantages are achieved in part by a method of manufacturing a semiconductor device, which method comprises the sequential steps of:

(a) providing a device precursor structure comprising a semiconductor substrate including a surface comprising first and second, spaced-apart electrically isolated regions of opposite conductivity type formed therein, each of the first and second regions having a respective layer stack formed on a portion of the surface of the region, each layer stack comprising:
  i. a thin gate insulating layer in contact with the substrate surface; and
  ii. a gate electrode layer formed on the gate insulating layer, each layer stack comprising a pair of opposing side surfaces and a top surface;

(b) forming a first, relatively narrow, tapered sidewall spacer on each pair of opposing side surfaces of the first and second layer stacks, the fox sidewall spacers comprising a relatively etch-resistant first material;

(c) forming a second, relatively wide, tapered sidewall spacer over each of the first sidewall spacers of the first and second layer stacks, the second sidewall spacers comprising a relatively easily etched amorphous semiconductor second material;

(d) forming a first mask comprising a patterned layer of a masking material selectively covering the top surface and the first and second sidewall spacers on each of the pair of opposing side surfaces of the first layer stack, the layer of masking material extending for a preselected lateral distance over the portions of the substrate surface adjacent the first layer stack;

(e) selectively implanting dopant impurities into exposed portions of the substrate surface adjacent the first and second sidewall spacers formed on opposing side surfaces of the second layer stack, the dopant impurities being of a conductivity type opposite that of the first region and forming a pair of relatively deep, heavily-doped source/drain regions in the substrate, each being laterally spaced from a respective proximal edge of the gate insulating layer stack by a distance substantially equal to the combined width of the lower ends of the first and second sidewall spacers adjacent the substrate surface;

(f) selectively removing the second, relatively wide sidewall spacers from the opposing side surfaces of the second layer stack by an etching process;

(g) selectively implanting dopant impurities into exposed portions of the substrate surface adjacent the first sidewall spacers formed on opposing side surfaces of the second layer stack, the dopant impurities being of a conductivity type opposite that of the second region and forming a pair of relatively shallow, lightly or moderately-doped source/drain extensions in the substrate extending from a proximal edge of a respective heavily-doped source/drain region to just beneath a respective proximal edge of the gate insulating layer of the second layer stack, whereby a first channel conductivity type MOS transistor is formed;

(h) removing the first mask by an etching process;

(i) forming a second mask comprising a patterned layer of a masking material selectively covering the top surface and the first and second sidewall spacers on each of the pair of opposing side surfaces of the second layer stack, the layer of masking material extending for a preselected lateral distance over the portions of the substrate surface adjacent the second layer stack; and (j) performing a sequence of processing steps corresponding to steps (e)–(h), for implanting opposite conductivity type dopant impurities into exposed substrate surface portions of the first region adjacent the first and/or second sidewall spacers formed on the opposing side surfaces of the first layer stack and for removing the second mask, whereby a complementary second channel conductivity type MOS transistor is formed in spaced adjacency to the first channel conductivity type MOS transistor.

In embodiments according to the invention, step (a) comprises providing a monocrystalline silicon wafer substrate having electrically isolated n- and p-type regions formed in the substrate surface, and each layer stack comprises a thin gate insulating layer comprising a silicon oxide layer about 25–50 Å thick and a gate electrode layer comprising heavily-doped polysilicon; step (b) comprises forming the first sidewall spacers from a dielectric material selected from silicon oxides, silicon nitrides, and silicon oxynitrides, each of the first, relatively narrow, tapered sidewall spacers has a width profile varying from about 75 to about 300 Å at the wider lower ends thereof adjacent the substrate surface to the narrower upper ends thereof; step (c) comprises forming the second sidewall spacers from an amorphous silicon semiconductor material blanket-deposited over the surface of the substrate by a chemical vapor deposition (CVD) or plasma enhanced chemical vapor deposition (PECVD) method utilizing a silicon-containing gas, or by a physical vapor deposition method (PVD) utilizing a silicon-containing source, followed by anisotropic etching of the laterally extending surfaces of the blanket-deposited layer, each of the resulting second, relatively wide, tapered sidewall spacers having a width profile varying from about 125 to about 500 Å at the wider lower ends thereof adjacent the substrate surface to the narrower upper ends thereof; step (d) comprises forming the first mask from a patterned layer of a photoresist material; step (e) comprises selectively implanting opposite conductivity type dopant ions at dosages of from about $5 \times 10^{14}$ to about $5 \times 10^{15}$ atoms/cm$^2$ and energies of from about 20 to about 60 KeV, followed by thermal annealing to activate and diffuse the implanted dopant ions to form the pair of relatively deep, heavily-doped source/drain regions, each of the source/drain regions having a preselected junction depth below the substrate surface; step (f) comprises removing the amorphous silicon second sidewall spacers by a selective etching process; step (g) comprises selectively implanting opposite conductivity type dopant ions at dosages of from about $5 \times 10^{13}$ to about $5 \times 10^{14}$ atoms/cm$^2$ and energies of from about 5 to about 30 KeV, followed by thermal annealing to activate and diffuse the implanted dopant ions to form the pair of relatively shallow, lightly or moderately-doped source/drain extensions; and step (i) comprises forming t he second mask from a patterned layer of a photoresist material.

According to another aspect of the present invention, a method of manufacturing a silicon-based CMOS transistor device is provided, which method comprises the sequential steps of:

(a) providing a device precursor structure comprising a monocrystalline silicon wafer substrate including a surface comprising first and second, spaced-apart, electrically isolated regions of opposite conductivity type formed therein, each of the first and second regions having a respective layer stack formed on a portion of the surface of the region, each layer stack comprising:

i. a thin gate insulating layer comprising a silicon oxide layer about 25–50 Å thick in contact with the wafer substrate surface; and ii. a gate electrode layer comprising heavily-doped polysilicon formed on the gate insulating layer, the layer stack comprising a pair of opposing side surfaces and a top surface;

(b) forming a first relatively narrow, tapered sidewall spacer on each pair of opposing side surfaces of the first and second layer stacks, each of the first sidewall spacers comprising a first, relatively etch-resistant material selected from silicon oxides, silicon nitrides, and silicon oxynitrides;

(c) forming a second, relatively wide, tapered sidewall spacer over each of the first sidewall spacers of the first and second layer stacks, the second sidewall spacers comprising relatively easily etched amorphous silicon material;

(d) forming a first mask comprising a patterned layer of a photoresist material selectively covering the top surface and the first and second sidewall spacers on each of the opposing side surfaces of the first layer stack, the layer of photoresist material extending for a preselected lateral distance over the portions of the wafer substrate surface adjacent the first layer stack;

(e) selectively implanting dopant impurities into exposed portions of the wafer substrate surface adjacent the first and second sidewall spacers formed on opposing side surfaces of the second layer stack, the dopant impurities being of a conductivity type opposite that of the second region and forming a pair of relatively deep, heavily-doped source/drain regions in the wafer substrate, each being laterally spaced from a respective proximal edge of the gate insulating layer of the second layer stack by a distance substantially equal to the combined width of the lower ends of the first and second sidewall spacers adjacent the substrate surface;

(f) selectively removing the amorphous silicon second, relatively wide sidewall spacers from the opposing side surfaces of the second layer stack by etching;

(g) selectively implanting dopant impurities into exposed portions of the wafer substrate surface adjacent the first sidewall spacers formed on opposing side surfaces of the second layer stack, the dopant impurities being of a conductivity type opposite that of the second region and forming a pair of relatively shallow, lightly or moderately-doped source/drain extensions in the wafer substrate extending from a proximal edge of a respective heavily-doped source/drain region to just beneath a respective proximal edge of the gate insulating layer of the second layer stack, whereby a first channel conductivity type MOS transistor is formed;

(h) removing the first mask comprising a patterned layer of a photoresist material by an etching process;

(i) forming a second mask comprising a patterned layer of a photoresist material selectively covering the top surface and the first and second sidewall spacers on each of the pair of opposing side surfaces of the second layer stack, the layer of masking material extending for a preselected lateral distance over the portions of the wafer substrate surface adjacent the second layer stack; and (j) performing a sequence of processing steps corresponding to steps (e)–(h), for implanting opposite conductivity type dopant impurities into exposed wafer substrate surface portions of said fiat region adjacent the first and/or second sidewall spacers formed on opposing side surfaces of the first layer stack and for removing the second photoresist mask, whereby a complementary second channel conductivity type MOS transistor is formed in spaced adjacency to the first channel conductivity type MOS transistor.

According to an embodiment of the present invention, the first region comprises n-type silicon, the second region comprises p-type silicon, a PMOS transistor is formed in the first region, and an NMOS transistor is formed in the second region.

According to another embodiment of the present invention, the first region comprises p-type silicon, the second region comprises n-type silicon, an NMOS transistor is formed in the first region, and a PMOS transistor is formed in the second region.

Additional advantages and aspects of the present invention will become readily apparent to those skilled in the art from the following detailed description, wherein only the preferred embodiment of the present invention is shown and described, simply by way of illustration of the best mode contemplated for carrying out the method of the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

Reference is made to the attached drawings, which are to be taken together with the following detailed description for a full understanding of the features and advantages provided by the present invention, wherein.

DESCRIPTION OF THE INVENTION

Figure 1A:
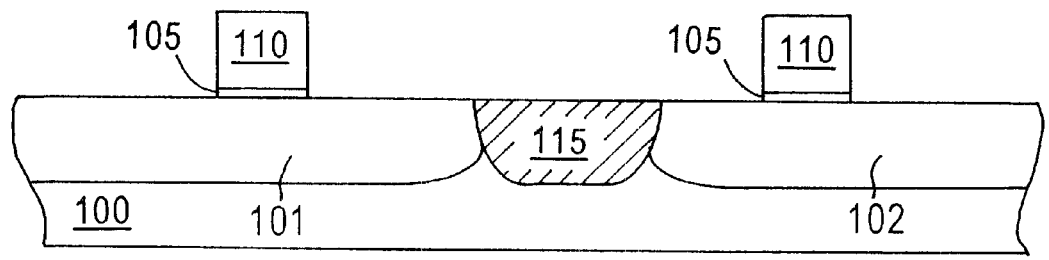
FIGS. 1(A)–1(G) illustrate, in simplified, cross-sectional form, a conventional sequence of processing steps for forming CMOS semiconductor devices.
Figure 1B:
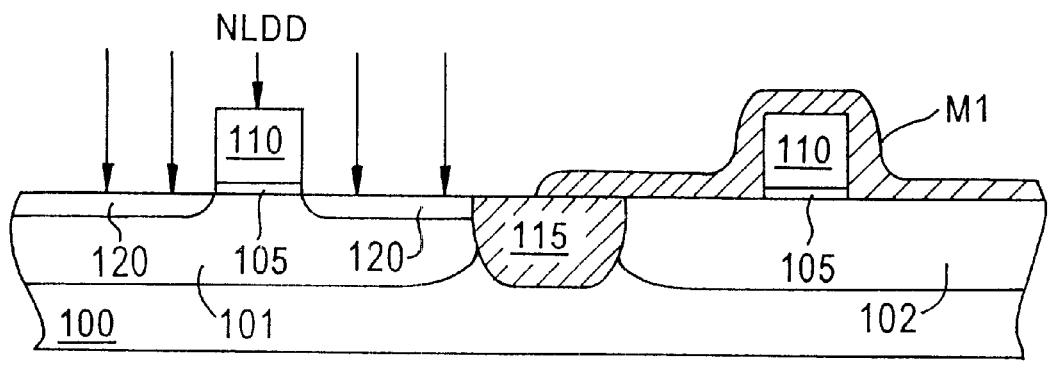
Figure 1C:
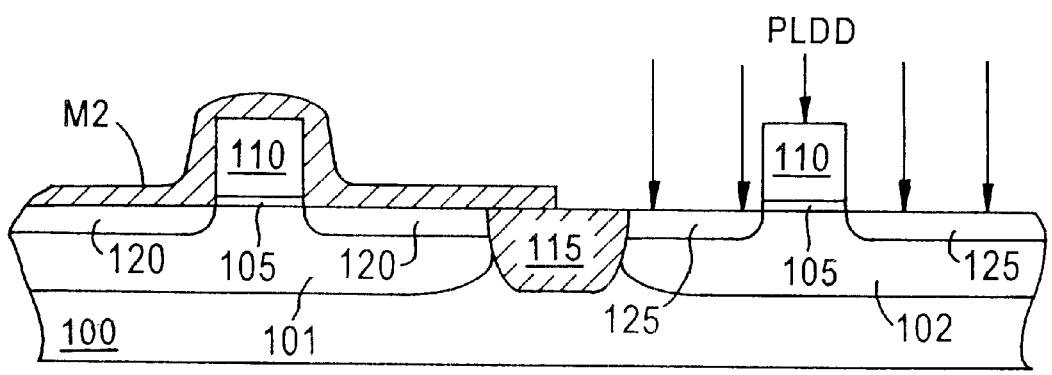
Figure 1D:
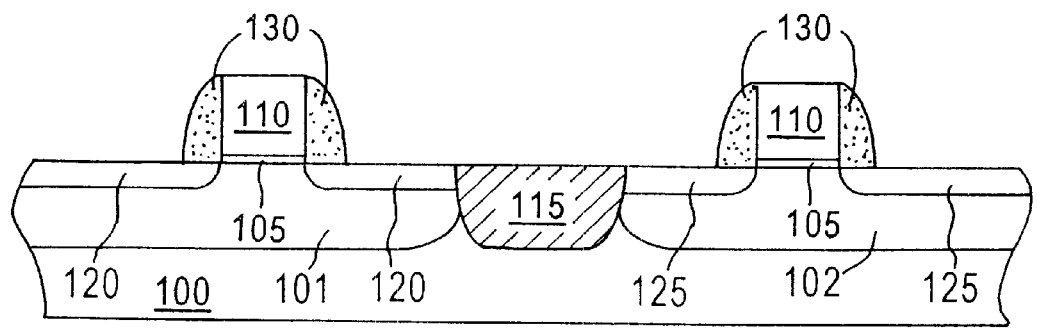
Figure 1E:
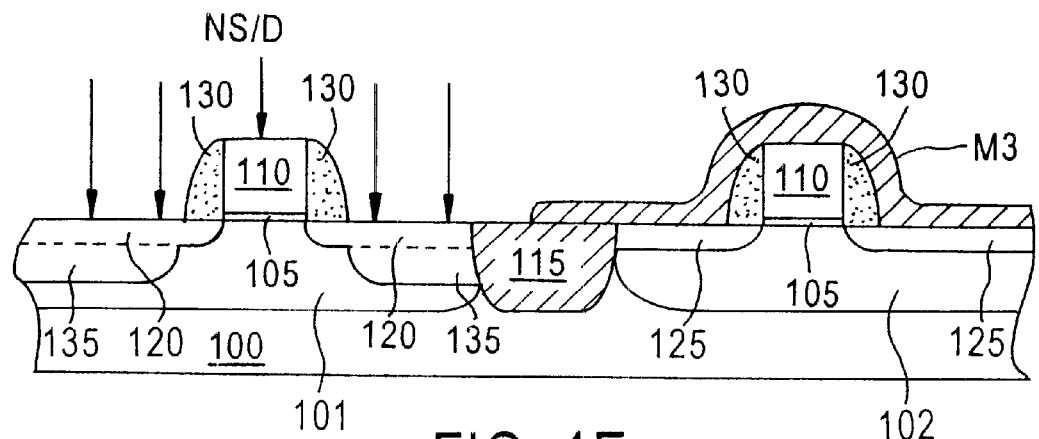
Figure 1F:
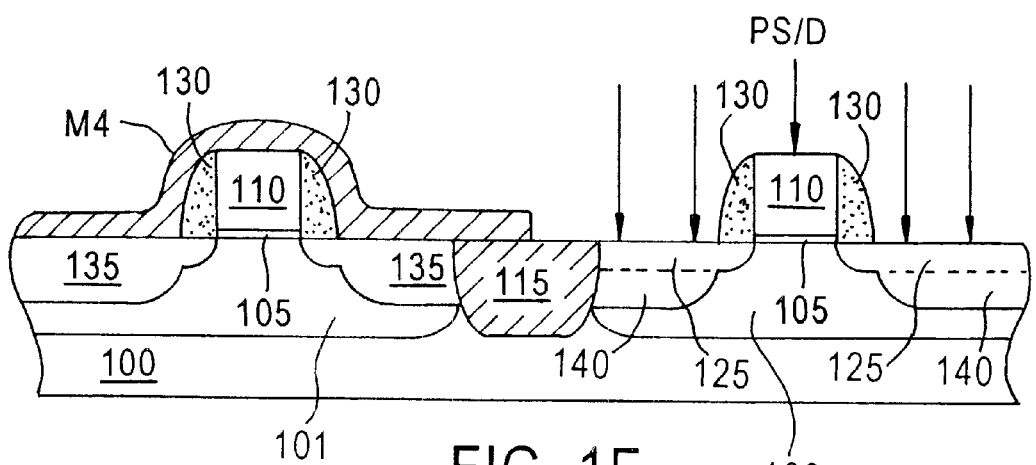
Figure 1G:
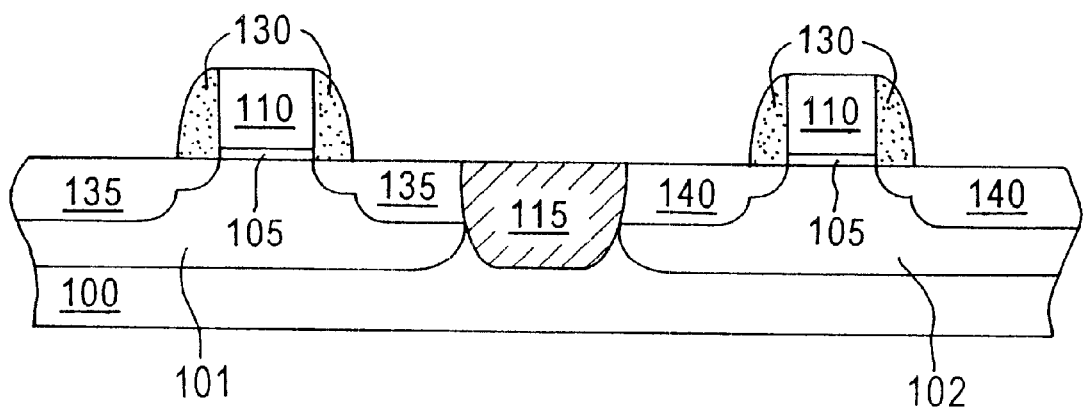
Figure 2A:
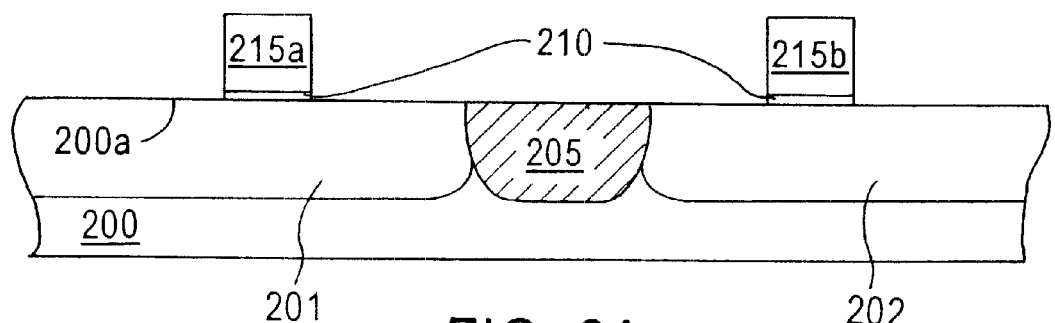
FIGS. 2(A)–2(J) illustrate, in simplified, cross-sectional form, a sequence of processing steps for forming CMOS semiconductor devices according to the method of the present invention.

An embodiment of the present invention is illustrated in FIGS. 2(A)–2(J). Referring to FIG. 2(A) a device precursor structure, analogous in all respects to that shown in FIG. 1(A), is provided, and comprises a field oxide area 205 (or other conventional isolation means, e.g., shallow trench isolation) formed, as by local oxidation of silicon (LOCOS), in semiconductor substrate 200, typically a monocrystalline silicon wafer, to electrically separate p-type well region 201 and n-type well region 202 formed therein, by conventional techniques not described herein for brevity. As used throughout the present disclosure and claims, the term "substrate" denotes a semiconductor substrate per se or an epitaxial semiconductor layer formed on a semiconductor substrate. A layer stack comprising a thin gate oxide layer 210, typically a silicon oxide layer about 25–50 Å thick, formed in contact with substrate surface 200a, as by thermal oxidation, and a respective overlying electrically conductive gate electrode layer 215g, 215b, typically of heavily-doped polysilicon, are formed over respective portions of the surface areas of each of the oppositely doped regions 201 and 202 by conventional techniques not described herein in order to not unnecessarily obscure the present invention. Gate electrode 215a will be associated with source/drain regions formed by implantation of n-type dopant impurities and gate electrode 215b will be associated with source/drain regions formed by implantation of p-type dopant impurities.

Figure 2B:
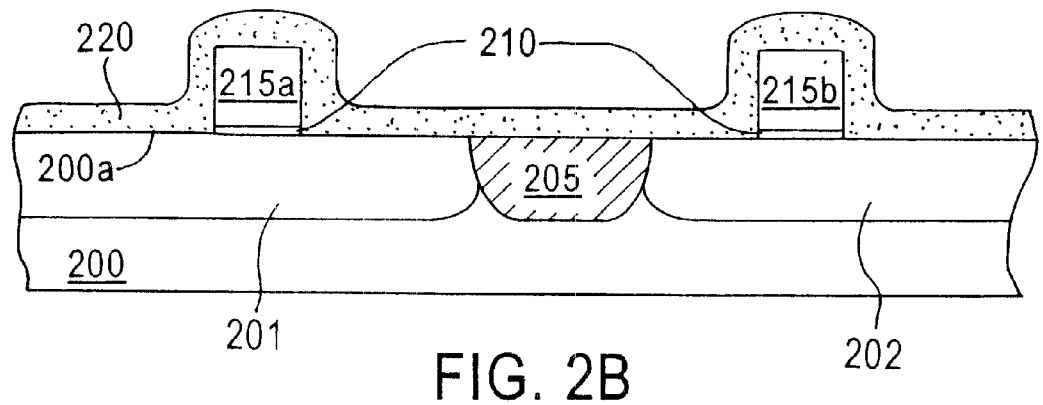
Figure 2C:
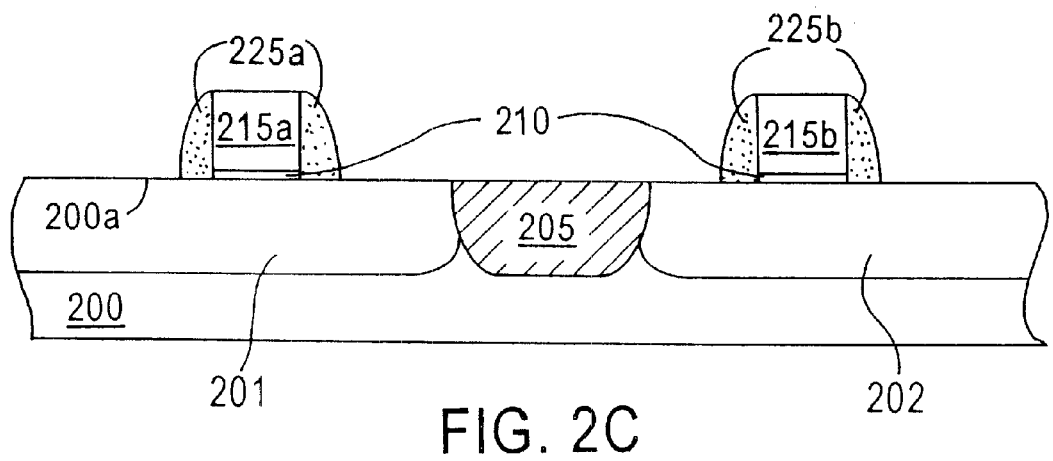

Referring to FIG. 2(B), a blanket layer 220 of a relatively etch resistant insulating material, such as a silicon oxide, silicon nitride, or silicon oxynitride, is then deposited over substrate surface 200a and the layer stacks, as by conventional techniques. Adverting to FIG. 2(C), layer 220 is then anisotropically etched, as by conventional techniques determined by the particular material of layer 220, to form relatively thin first, or inner, tapered sidewall spacers 225a and 225b having a width profile varying from about 75 to about 300 Å at their thicker lower ends adjacent substrate surface 200a to their thinner upper ends.

Figure 2D:
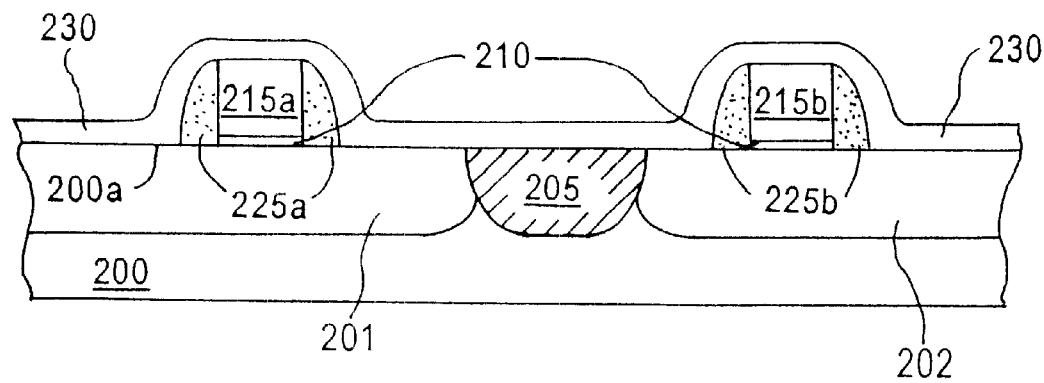
Figure 2E:
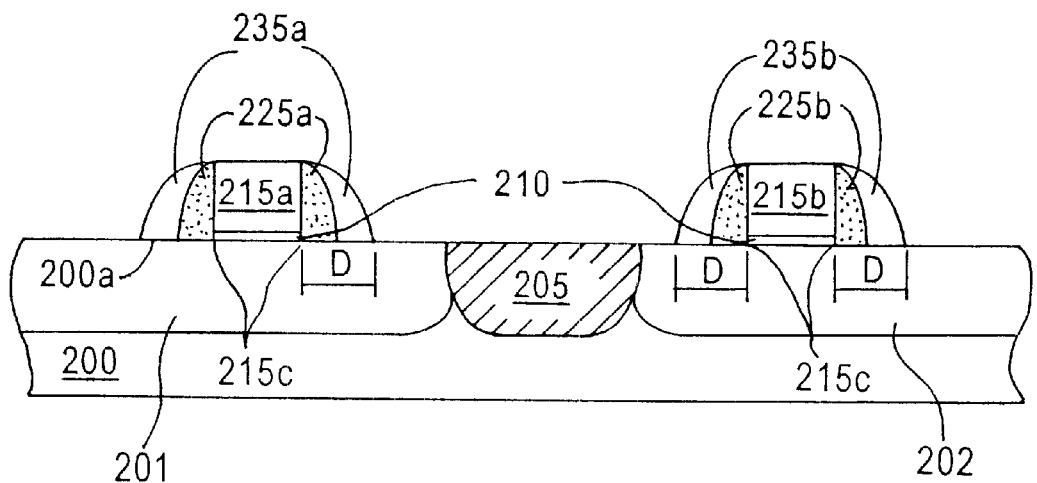

Next, as shown in FIG. 2(D), a conformal blanket layer 230 of a relatively easily etched amorphous semiconductor, preferably amorphous silicon, is deposited, as by chemical vapor deposition (CVD) or plasma enhanced chemical vapor deposition utilizing a silicon-containing gas, e.g., silane ($SiH_4$), or by a physical vapor deposition (PVD) method utilizing a silicon-containing source, e.g., cathode sputtering or vacuum evaporation. Adverting to FIG. 2(E), the amorphous semiconductor (e.g., amorphous silicon) layer 230 is then anisotropically etched, to form relatively easily etched, disposable, relatively wide, second, or outer sidewall spacers 235a and 235b on inner sidewall spacers 225a, 225b, respectively. After etching, the tapered outer sidewall spacers 225a and 225b have a width profile varying from about 125 to about 500 Å at their thicker lower ends adjacent substrate surface 200a to their thinner upper ends.

The sum D of the thicknesses of the inner and outer sidewall spacers 225a–b and 235a–b, respectively, at their wider lower ends adjacent to and extending over substrate surface 200a is preferably from about 200 to about 800Å, the major part of which sum D comprises the thickness of the second, outer sidewall spacers 235a–b. The distance which the first, or inner, sidewall spacers 225a–b extend onto substrate main surface 200a determines the placement of subsequently implanted lightly- or moderately-doped source/drain extensions with respect to the respective proximal edges 215c of the gate oxide/gate electrode layer stacks 210/215a–b. Likewise, the distance which the disposable second, outer, sidewall spacers 235a–b extend onto substrate main surface 200a determines the placement of subsequently formed moderately- to heavily-doped source/drain regions with respect to gate edges 215c. Since the locations of these source/drain regions and associated junctions significantly affect transistor electrical characteristics, the widths of the inner spacers 225a,225b and disposable outer spacers 235a, 235b can be tailored to optimize the performance of the finished device.

Figure 2F:
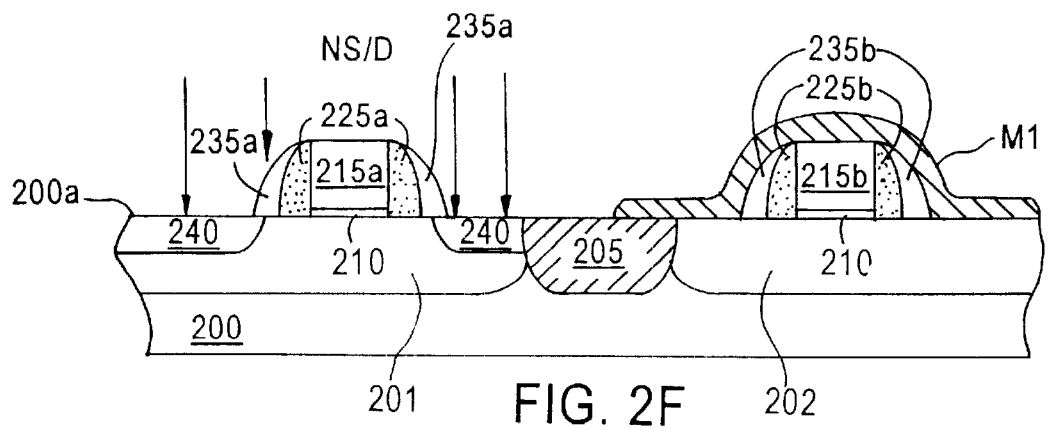
Figure 2G:
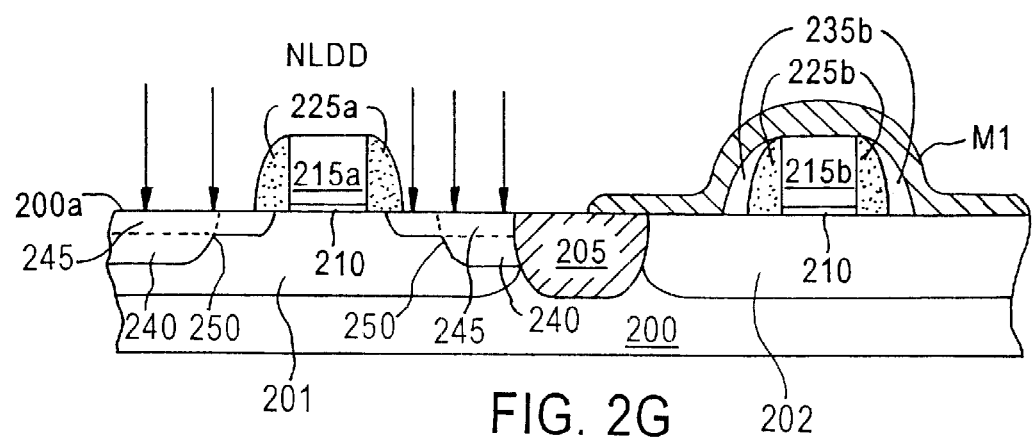

Next, referring to FIG. 2(F), a first patterned photoresist mask M1 is formed on gate 215b and extends for a preselected lateral distance over main substrate surface 200a to cover portions of main surface 200a which subsequently receive p-type moderate or heavy source/drain implants. N-type dopant impurities NS/M), such as phosphorus or arsenic containing ions, are then implanted into substrate 200, as by ion implantation, typically at a dosage of from about $5\times10^{14}$ to about $5\times10^{15}$ atoms/cm$^2$ at an energy of from about 40 to about 60 KeV, to form n-type moderate or heavy source/drain implants 240. Adverting to FIG. 2(G), disposable amorphous silicon outer sidewall spacers 235a are thereafter selectively removed by etching, whereby inner sidewall spacers 225a and first photoresist mask M1 are retained. N-type impurities NLDD, such as phosphorus or arsenic containing ions, are then implanted into substrate 200, as by ion implantation, typically at a dosage of from about $5\times10^{13}$ to about $5\times10^{14}$ atoms/cm$^2$ at an energy of from about 10 to about 30 KeV, to form n-type lightly- or moderately-doped source/drain extension implants 245, which form n-type "stepped" source/drain implants 250 in conjunction with n-type moderate or heavy source/drain implants 240. As in conventional processing, NLDD dopant impurities are implanted at lower dosage and energy than NS/D dopant impurities.

Figure 2H:
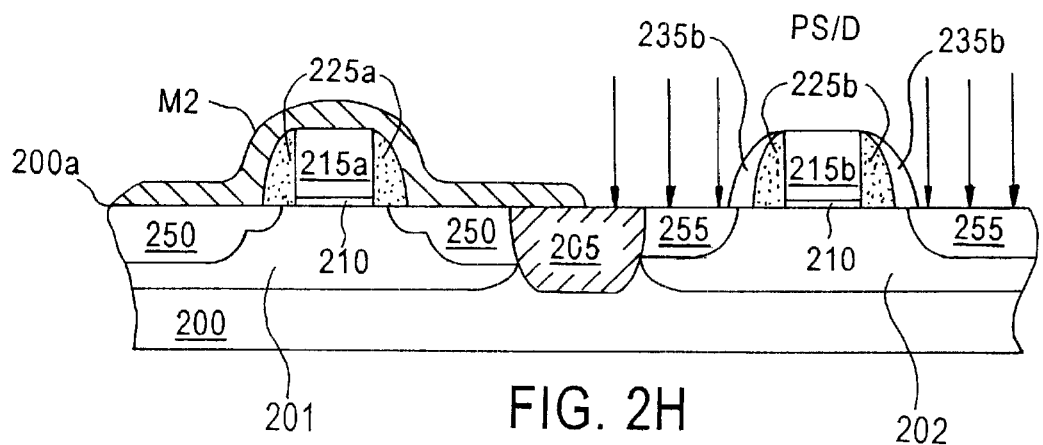
Figure 2I:
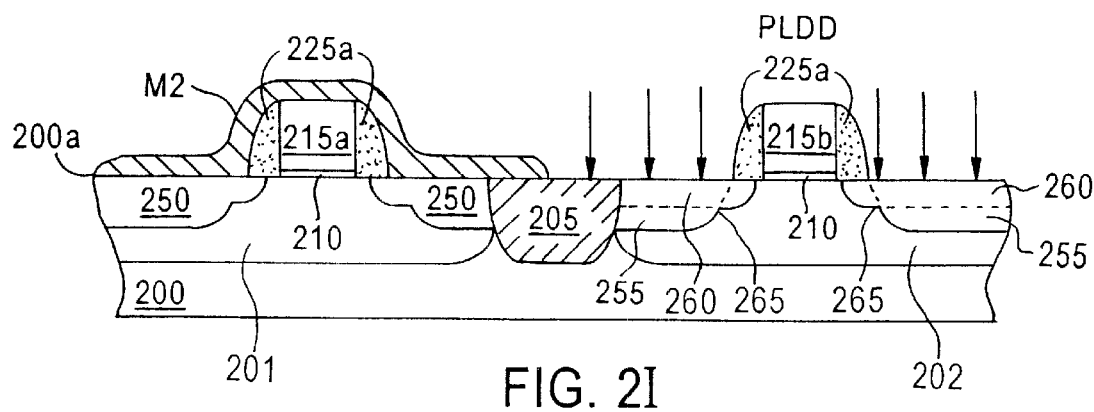

Referring now to FIG. 2(H), first mask M1 is then removed as by conventional methodology, and second patterned photoresist mask M2 is formed on gate 215*a* and extends for a preselected lateral distance over main substrate surface 200*a* to cover the previously implanted n-type stepped source/drain implants 250. P-type dopant impurities PS/D, such as boron-containing ions, are then implanted into substrate 200, as by ion implantation, typically at a dosage of from about $5 \times 10^{14}$ to about $5 \times 10^{15}$ atoms/cm$^2$ at an energy of from about 20 to about 40 KeV, to form p-type moderate or heavy source/drain implants 255. Adverting to FIG. 2(I), disposable amorphous silicon outer sidewall spacers 235*b* are then selectively removed, as by the etching process described above with respect to removal of outer sidewall spacers 235*a*, whereby inner sidewall spacers 225*b* and second photoresist mask M2 are retained. P-type dopant impurities PLDD, such as boron-containing ions, are then implanted, as by ion implantation, typically at a dosage of from about $5 \times 10^{13}$ to about $5 \times 10^{14}$ atoms/cm$^2$ at an energy of from about 5 to about 10 KeV, to form lightly- or moderately-doped source/drain extension implants 260 which form p-type "stepped" source/drain implants 265 in conjunction with ptype moderate or heavy source/drain implants 255. As in conventional MOS transistor processing, PLDD dopant impurities are implanted at lower dosage and energy than PS/D dopant impurities.

The materials of inner sidewall spacers 225*a*, 225*b* and outer, disposable spacers 235*a*, 235*b* are selected such that disposable spacers 235*a*, 235*b* are readily removable by etching, vis-a-vis the inner sidewall spacers 225*a*, 225*b* and first and second patterned photoresist masks M1, M2. Consequently, the dimensions and protective qualities of the inner sidewall spacers 225*a*, 225*b* can be maintained throughout processing and standard thickness photoresist layers for forming patterned masks M1, M2 can be utilized.

Figure 2J:
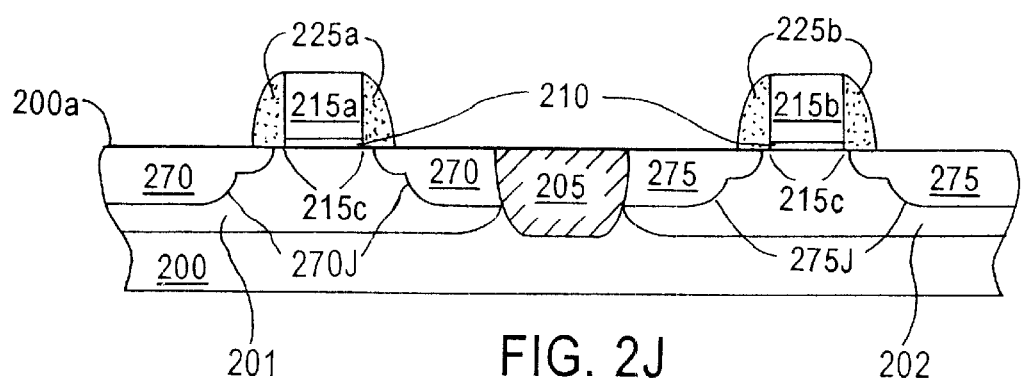

Referring now to FIG. 2(J), after removal of second photoresist mask f2, the thus formed structure is heated to diffuse and electrically activate the implanted dopant impurities NLIDD, PLDD, NS/D, and PS/D in stepped source/drain implants 250 and 265 to form source/drain regions 270, 275, as by rapid thermal annealing (RTA) at a temperature of from about 900 to about 1100° C. for less than about 30 seconds. Preferably, NS/D and NLDD implants are performed at higher energy than the PS/D and PLDD implants, resulting in the n-type stepped source/drain implants 250 being deeper than the p-type stepped source/drain implants 265 prior to the heating step. N-type dopant impurities diffuse less quickly when heated than p-type dopant impurities. Thus, by employing higher energy to form the n-type stepped source/drain implants 250 deeper than the p-type stepped source/drain implants 265, the depths of both n-type and p-type junctions 270J, 275J are optimized after the heating step, resulting in improved device performance.

Subsequent processing steps include conducting a silicidation process to form electrodes on gates 215*a*, 215*b* and on source/drain regions 210, 275, employing the retained first, or inner, sidewall spacers 225*a*, 225*b* as insulators. Alternatively, a dielectric layer can be deposited over substrate main surface 200*a*, and gates 215*a*, 215*b*, and contact holes to source/drain regions 270, 275 and gates 215*a*, 215*b* patterned.

As a consequence of the use of disposable second, or outer spacers 235*a*, 235*b*, the present methodology enables two implants i.e., a moderate or heavy source/drain implant and a lightly- or moderately-doped source/drain extension implant, to be performed with a single mask, thereby reducing from four to two the number of critical masks needed for the formation of, e.g, a CMOS device comprising a plurality of MOS transistors of different channel conductivity type in a common substrate. Thus production cost is reduced and product throughput and production yield arm increased. In addition, the retained first, or inner sidewall spacers 225*a*, 225*b* prevent undesirable dopant diffusion under gate edges 215*c*, and protect the gate insulator/gate electrode layer stack during etching and subsequent processing for contact formation.

The present invention is applicable to the manufacture of various types of semiconductor devices, and has particular utility in the manufacture of high density integration semiconductor devices having a design rule of about 0.18 μm and under.

The present invention can be practiced by employing conventional materials methodology and equipment. Accordingly, the details of such conventional materials methodology, and equipment are not set forth herein in detail. In the previous descriptions, numerous specific details are set forth such as specific materials, structures, chemicals, processes, etc, in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a CMOS transistor device, which method comprises the sequential steps of:
   (a) providing a device precursor structure comprising a semiconductor substrate including a surface comprising first and second, spaced-apart, electrically isolated regions of opposite conductivity type formed therein, each of said first and second regions having a respective layer stack formed on a portion of the surface of the region, each said layer stack comprising:
      i. a thin gate insulating layer in contact with said substrate surface; and
      ii. a gate electrode layer formed on said gate insulating layer, each said layer stack comprising a pair of opposing side surfaces and a top surface;
   (b) forming a first, relatively narrow, tapered sidewall spacer on each pair of opposing side surfaces of said first and second layer stacks, the first sidewall spacers comprising a relatively etch-resistant first material;
   (c) forming a second, relatively wide, tapered sidewall spacer over each of said first sidewall spacers of said first and second layer stacks, the second sidewall spacers comprising a relatively easily etched amorphous semiconductor second material;
   (d) forming a first mask comprising a patterned layer of a masking material selectively covering the top surface and the first and second sidewall spacers on each of the pair of opposing side surfaces of said first layer stack, said layer of masking material extending for a preselected lateral distance over the portions of said substrate surface adjacent said rim layer stack;

(e) selectively implanting dopant impurities into exposed portions of said substrate surface adjacent the first and second sidewall spacers formed on opposing side surfaces of the second layer stack, said dopant impurities being of a conductivity type opposite that of said second region and forming a pair of relatively deep, heavily-doped source/drain regions in said substrate, each being laterally spaced from a respective proximal edge of the gate insulating layer of the second layer stack by a distance substantially equal to the combined width of the lower ends of the first and second sidewall spacers adjacent the substrate surface;

(f) selectively removing the second, relatively wide sidewall spacers from the opposing side surfaces of said second layer stack by an etching process;

(g) selectively implanting dopant impurities into exposed portions of said substrate surface adjacent the first sidewall spacers formed on opposing side surfaces of the second layer stack, said dopant impurities being of a conductivity type opposite that of said second region and forming a pair of relatively shallow, lightly- or moderately-doped source/drain extensions in said substrate extending from a proximal edge of a respective heavily-doped source/drain region to just beneath a respective proximal edge of the gate insulating layer of the second layer stack, whereby a first channel conductivity type MOS transistor is formed;

(h) removing the first mask by an etching process;

(i) forming a second mask comprising a patterned layer of a masking material selectively covering the top surface and the first and second sidewall spacers on each of the pair of opposing side surfaces of the second layer stack, said layer of masking material extending for a preselected lateral distance over the portions of said substrate surface adjacent said second layer stack; and (j) performing a sequence of processing steps corresponding to steps (e)–(h), for implanting opposite conductivity type dopant impurities into exposed substrate surface portions of said first region adjacent the first and/or second sidewall spacers formed on the opposing side surfaces of the first layer stack and for removing the second mask, whereby a complementary second channel conductivity type MOS transistor is formed in spaced adjacency to the first channel conductivity type MOS transistor.

2. The method as in claim 1, wherein step (a) comprises providing a monocrystalline silicon wafer substrate having electrically isolated n- and p-type regions formed in said substrate surface, and each layer stack comprises a thin gate insulating layer comprising a silicon oxide layer about 25–50 Å thick and a gate electrode layer comprising heavily-doped polysilicon.

3. The method as in claim 1, wherein step (b) comprises forming said first sidewall spacers from a dielectric material selected from silicon oxides silicon nitrides, and silicon oxynitrides.

4. The method as in claim 3, wherein each of said fist, relatively narrow, tapered sidewall spacers has a width profile varying from about 75 to about 300 Å at the wider lower ends thereof adjacent said substrate surface to the narrower upper ends thereof.

5. The method as in claim 1, wherein step (c) comprises forming said second sidewall spacers from an amorphous silicon semiconductor material.

6. The method as in claim 5, wherein step (c) comprises forming said second sidewall spacers by blanket-depositing amorphous silicon deposited by a chemical vapor deposition (CVD) or plasma enhanced chemical vapor deposition (PECVD) method utilizing a silicon-containing gas, or by a physical vapor deposition method (PVD) utilizing a silicon-containing source, followed by anisotropic etching of the laterally extending surfaces thereof.

7. The method as in claim 5, wherein each of said second, relatively wide, tapered sidewall spacers has a width profile varying from about 125 to about 500 Å at the wider lower ends thereof adjacent said substrate surface to the narrower upper ends thereof.

8. The method as in claim 1, wherein step (d) comprises forming said first mask from a patterned layer of a photoresist material.

9. The method as in claim 1, wherein step (e) comprises selectively implanting opposite conductivity type dopant ions at dosages of from about $5 \times 10^{14}$ to about $5 \times 10^{15}$ atoms/cm$^2$ and energies of from about 20 to about 60 KeV, followed by thermal annealing to activate and diffuse the implanted dopant ions to form said pair of relatively deep, heavily-doped source/drain regions.

10. The method as in claim 6, wherein step (f) comprises selectively etching said amorphous silicon second sidewall spacers.

11. The method as in claim 1, wherein step (g) comprises selectively implanting opposite conductivity type dopant ions at dosages of from about $5 \times 10^{13}$ to about $5 \times 10^{14}$ atoms/cm$^2$ and energies of from about 5 to about 30 KeV, followed by thermal annealing to activate and diffuse the implanted dopant ions to form said pair of relatively shallow, lightly- or moderately-doped source/drain extensions.

12. The method as in claim 1, wherein step (i) comprises forming said second mask from a patterned layer of a photoresist material.

13. A method of manufacturing a CMOS transistor device, which method comprises the sequential steps of:

(a) providing a device precursor structure comprising a monocrystalline silicon wafer substrate including a surface comprising first and second, spaced-apart electrically isolated regions of opposite conductivity type formed therein, each of said first and second regions having a respective layer stack formed on a portion of the surface of the region, each said layer stack comprising:

i. a thin gate insulating layer comprising a silicon oxide layer about 25–50 Å thick in contact with said wafer substrate surface; and ii. a gate electrode layer comprising heavily-doped polysilicon formed on said gate insulating layer, said layer stack comprising a pair of opposing side surfaces and a top surface;

(b) forming a first, relatively narrow, tapered sidewall spacer on each pair of opposing side surfaces of said first and second layer stacks, each of said first sidewall spacers comprising a first, relatively etch-resistant material selected from silicon oxides, silicon nitrides, and silicon oxynitrides;

(c) forming a second, relatively wide, tapered sidewall spacer over each of said first sidewall spacers of said first and second layer stacks, said second sidewall spacers comprising a relatively easily etched amorphous silicon material;

(d) forming a first mask comprising a patterned layer of a photoresist material selectively covering the top surface and the first and second sidewall spacers on each of the opposing side surfaces of said first layer stack, said layer of photoresist material extending for a preselected lateral distance over the portions of said wafer substrate surface adjacent said first layer stack;

(e) selectively implanting dopant impurities into exposed portions of said wafer substrate surface adjacent the first and second sidewall spacers formed on opposing side surfaces of the second layer stack, said dopant impurities being of a conductivity type opposite that of said second region and forming a pair of relatively deep, heavily-doped source/drain regions in said wafer substrate, each being laterally spaced from a respective proximal edge of the gate insulating layer of the second layer stack by a distance substantially equal to the combined width of the lower ends of the first and second sidewall spacers adjacent the substrate surface;

(f) selectively removing the amorphous silicon second, relatively wide sidewall spacers from the opposing side surfaces of said second layer stack by etching;

(g) selectively implanting dopant impurities into exposed portions of said wafer substrate surface adjacent the first sidewall spacers formed on opposing side surfaces of the second layer stack, said dopant impurities being of a conductivity type opposite that of the second region and forming a pair of relatively shallow, lightly- or moderately-doped source/drain extensions in said wafer substrate extending from a proximal edge of a respective heavily-doped source/drain region to just beneath a respective proximal edge of the gate insulating layer of the second layer stack, whereby a first channel conductivity type MOS transistor is formed;

(h) removing the first mask comprising a patterned layer of a photoresist material by an etching process;

(i) forming a second mask comprising a patterned layer of a photoresist material selectively covering the top surface and the first and second sidewall spacers on each of the pair of opposing side surfaces of the second layer stack, said layer of masking material extending for a preselected lateral distance over the portions of said wafer substrate surface adjacent said second layer stack; and (j) performing a sequence of processing steps corresponding to steps (e)–(h), for implanting opposite conductivity type dopant impurities into exposed wafer substrate surface portions of said first region adjacent the first and/or second sidewall spacers formed on the opposing side surfaces of the first layer stack and for removing the second photoresist mask, whereby a complementary second channel conductivity type MOS transistor is formed in spaced adjacency to the first channel conductivity type MOS transistor.

14. The method as in claim 13, wherein each of said first, relatively narrow, tapered sidewall spacers has a width profile varying from about 75 to about 300 Å at the wider lower ends thereof adjacent said wafer substrate surface to the narrower upper ends thereof; and each of said second, relatively wide, tapered sidewall spacers has a width profile varying from about 125 to about 500 Å at the wider lower ends thereof adjacent said wafer substrate surface to the narrower upper ends thereof.

15. The method as in claim 13, wherein step (e) comprises selectively implanting opposite conductivity type ions at dosages of from about $5\times10^{14}$ to about $5\times10^{15}$ atoms/cm$^2$ and energies of from about 20 to about 60 KeV, followed by thermal annealing to activate and diffuse the implanted dopant ions to form said pair of relatively deep, heavily-doped source/drain regions.

16. The method as in claim 13, wherein step (g) comprises selectively implanting opposite conductivity type dopant ions at dosages of from about $5\times10^{13}$ to about $5\times10^{14}$ atoms/cm$^2$ and energies of from about 5 to about 30 KeV, followed by thermal annealing to activate and diffuse the implanted dopant ions to form said pair of relatively shallow, lightly- or moderately-doped source/drain extensions.

17. The method as in claim 13, wherein said first region comprises n-conductivity type silicon, said second region comprises p-conductivity type silicon, a PMOS transistor is formed in said first region, and an NMOS transistor is formed in said second region.

18. The method as in claim 13, wherein said first region comprises p-conductivity type silicon, said second region comprises n-conductivity type silicon, an NMOS transistor is formed in said first region, and a PMOS transistor is formed in said second region.

* * * * *